US012095217B2

(12) United States Patent
Tsorng et al.

(10) Patent No.: US 12,095,217 B2
(45) Date of Patent: Sep. 17, 2024

(54) CABLE RELEASE DEVICE AND METHOD FOR RELEASING A CABLE

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Yu-Cheng Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 366 days.

(21) Appl. No.: 17/714,670

(22) Filed: Apr. 6, 2022

(65) Prior Publication Data

US 2023/0327387 A1   Oct. 12, 2023

(51) Int. Cl.
  *H01R 43/26*  (2006.01)
  *H05K 1/18*  (2006.01)
  *H01R 12/75*  (2011.01)

(52) U.S. Cl.
  CPC ............ *H01R 43/26* (2013.01); *H05K 1/18* (2013.01); *H01R 12/75* (2013.01); *H05K 2201/09063* (2013.01); *H05K 2201/09072* (2013.01); *H05K 2201/10189* (2013.01)

(58) Field of Classification Search
  CPC .......... H05K 2201/09063; H05K 2201/09072; H05K 2201/10189; H05K 1/18; H01R 43/26; H01R 12/75; H01R 12/716; H01R 12/712
  See application file for complete search history.

(56) References Cited

U.S. PATENT DOCUMENTS

| | | | | | |
|---|---|---|---|---|---|
| 4,410,222 | A | * | 10/1983 | Enomoto | H01R 12/675 439/399 |
| 5,211,568 | A | * | 5/1993 | Yamada | H01R 13/633 439/153 |
| 5,634,803 | A | * | 6/1997 | Cheng | H05K 7/1409 439/157 |
| 7,458,144 | B2 | * | 12/2008 | Barina | H01R 43/26 439/352 |
| 7,850,473 | B1 | * | 12/2010 | Ozeki | H01R 12/79 439/260 |
| 9,130,309 | B2 | * | 9/2015 | Ozeki | H01R 43/26 |
| 9,281,615 | B1 | * | 3/2016 | Plaza | H01R 13/6275 |
| 9,331,426 | B2 | * | 5/2016 | Adams | H01R 13/6273 |
| 9,640,910 | B1 | * | 5/2017 | Chien | H01R 13/6275 |
| 9,893,457 | B2 | * | 2/2018 | Wojcik | H01R 13/502 |

(Continued)

FOREIGN PATENT DOCUMENTS

DE   102020100856 A1 *  7/2021

*Primary Examiner* — Marcus E Harcum
(74) *Attorney, Agent, or Firm* — NIXON PEABODY LLP (57) ABSTRACT

Cable release devices and methods are disclosed. The device includes a frame defining an aperture. The frame is sized to fit around a connector on a printed circuit board (PCB) within a computer system with the connector extending into the aperture. The device further includes a post extending from the frame. The device further includes a lever connected to the post. The lever includes a first end positioned such that the first end aligns with a latch of a cable when the cable is connected to the connector and when the frame is around the connector such that actuation of the lever causes the lever to depress the latch. The actuation causes the release of the cable from being retained by the connector.

20 Claims, 8 Drawing Sheets

(56) References Cited

U.S. PATENT DOCUMENTS

| | | | |
|---|---|---|---|
| 10,720,722 B2* | 7/2020 | Tsorng | H01R 43/0256 |
| 10,856,409 B1* | 12/2020 | Chuang | H05K 1/0278 |
| 2008/0119090 A1* | 5/2008 | Giefers | H01R 13/6273 |
| | | | 439/681 |
| 2011/0111617 A1* | 5/2011 | Handshaw | H01R 43/26 |
| | | | 439/352 |
| 2011/0176773 A1* | 7/2011 | Schmitz | G02B 6/3817 |
| | | | 439/345 |
| 2014/0377971 A1* | 12/2014 | Mathews | H01R 13/633 |
| | | | 439/153 |
| 2017/0093057 A1* | 3/2017 | Wang | G06K 7/0021 |
| 2019/0036253 A1* | 1/2019 | Wang | H01R 12/77 |
| 2019/0244065 A1* | 8/2019 | Chuang | G06K 7/0021 |
| 2019/0312385 A1* | 10/2019 | Shain | H01R 13/6275 |
| 2019/0348781 A1* | 11/2019 | Yufu | H01R 13/6594 |
| 2019/0393635 A1* | 12/2019 | Ikeda | H01R 12/79 |
| 2020/0006893 A1* | 1/2020 | Ding | G02B 6/3897 |
| 2020/0127395 A1* | 4/2020 | Wright | H05K 7/02 |
| 2020/0272119 A1* | 8/2020 | Mielnik | G05B 15/02 |
| 2020/0303887 A1* | 9/2020 | Draughon | H01R 43/26 |
| 2021/0305751 A1* | 9/2021 | Chen | H01R 13/516 |
| 2022/0085548 A1* | 3/2022 | Yi | H01R 12/7047 |
| 2022/0255261 A1* | 8/2022 | Yang | H01R 12/79 |
| 2022/0285868 A1* | 9/2022 | Ito | H01R 13/6272 |
| 2023/0012133 A1* | 1/2023 | Long | H05K 7/026 |
| 2023/0118676 A1* | 4/2023 | Pritz | H01R 12/7023 |
| | | | 385/92 |
| 2023/0268704 A1* | 8/2023 | Stoll | H01R 43/22 |
| | | | 29/764 |

* cited by examiner

CABLE RELEASE DEVICE AND METHOD FOR RELEASING A CABLE

FIELD OF THE INVENTION

The present invention relates generally to disconnecting cables within a computer system, and more specifically, to a device configured to assist with the release of a cable from a connector within a computer system, and the associated method of releasing the cable.

BACKGROUND OF THE INVENTION

Computer system designs have increasingly become more and more compact to allow for more and more components on smaller and smaller footprints. Yet, one aspect that remains relatively fixed is the space needed for releasing cables connected to connectors within computer systems.

Figure 1:
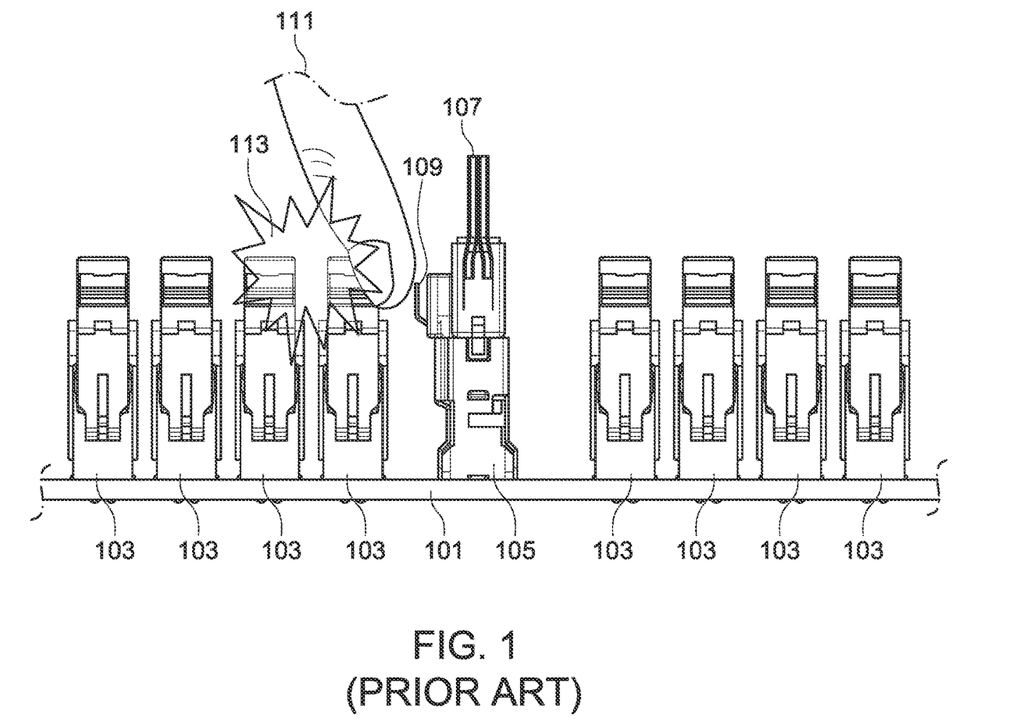
FIG. 1 shows a partial side view of a PCB.

FIG. 1 shows a printed circuit board (PCB) 101 that is found in computer systems, including server computer systems. The PCB 101 includes one or more slots 103 that accept one or more peripheral components. For example, the slots 103 can be a Peripheral Component Interconnect (PCI) slot, or any similar interconnect slot that accepts a peripheral component.

Among the slots 103 can be a connector 105. The connector 105 can accept a cable 107. The cable 107 can include a latch 109. Depressing the latch 109 releases the cable 107 from the connector 105. The cable 107 can then be removed from the connector 105. A user's finger 111 is required for depressing the latch 109. However, as shown in FIG. 1 by the element 113, a slot 103 nearest the connector 105 may block access of the user's finger 111 to the latch 109. The blocked access at the very least makes depressing the latch 109 difficult, if not impossible.

The present disclosure is directed to solving the above problems by providing a device that can access tight spaces for releasing components, such as cables, within computer systems.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a cable release device is disclosed. The device includes a frame defining an aperture. The frame is sized to fit around a connector on a printed circuit board (PCB). The PCB is within a computer system and the connector extends into the aperture. The device further includes a post extending from the frame. The device further includes a lever connected to the post. The lever includes a first end positioned such that the first end aligns with a latch of a cable when the cable is connected to the connector and when the frame is around the connector such that actuation of the lever causes the lever to depress the latch. The actuation causes the release of the cable from being retained by the connector.

According to one aspect of the above embodiment, a perimeter of the frame corresponds to a perimeter of the connector. According to another aspect of the above embodiment, the device further includes a projection extending from the frame. The projection cooperates with an aperture in the PCB to maintain the frame fitted around the connector as the lever is depressed. According to another aspect of the above embodiment, the projection includes a hook that releasably fixes the frame to the PCB. According to another aspect of the above embodiment, the post includes a pair of posts, and the lever is between the pair of posts. According to another aspect of the above embodiment, the lever is connected to the post at a junction point that allows the lever to rotate relative to the post. According to another aspect of the above embodiment, the lever includes a touch point that extends from the lever as a point of contact with the latch of the cable. According to another aspect of the above embodiment, a second end of the lever includes a curved section that provides more surface area for a user's finger to actuate the lever. According to another aspect of the above embodiment, the frame includes a gap that allows the frame to be fitted around the connector with the cable already retained by the connector.

According to another embodiment of the present disclosure, a computer system is disclosed. The computer system includes a printed circuit board (PCB) with a connector for connecting a cable to the PCB. The computer system further includes a device for releasing the cable from being retained by the connector. The device includes a frame defining an aperture. The frame is sized to fit around the connector with the connector extending into the aperture and the device being coupled to the PCB. The device further includes a post extending from the frame. The device further includes a lever connected to the post. The lever includes a first end that aligns with a latch of the cable, with the cable connected to the connector, and with the frame fitted around the connector such that actuation of the lever causes the lever to depress the latch and release the cable from being retained by the connector.

According to one aspect of the above embodiment, a perimeter of the frame corresponds to a perimeter of the connector. According to another aspect of the above embodiment, the PCB includes an aperture next to the connector. The frame includes a projection that extends from the frame. The projection cooperates with the aperture to maintain the frame fitted around the connector as the lever is depressed. According to another aspect of the above embodiment, the projection comprises a hook that releasably fixes the device to the PCB. According to another aspect of the above embodiment, the post includes a pair of posts, and the lever is between the pair of posts. According to another aspect of the above embodiment, the lever is connected to the post at a junction point that allows the lever to rotate relative to the post. According to another aspect of the above embodiment, the lever includes a touch point that extends from the lever as a point of contact with the latch of the cable. According to another aspect of the above embodiment, a second end of the lever includes a curved section for providing more surface area for a user's finger to actuate the lever. According to another aspect of the above embodiment, the frame includes a gap that allows the frame to be fitted around the connector with the cable already retained by the connector.

According to another embodiment of the present disclosure, a method includes providing a cable release device fitted around a connector of a printed circuit board (PCB). The connector is connected to a cable. The cable release device includes a frame defining an aperture. The frame is sized to fit around the connector with the connector extending into the aperture and the cable release device being coupled to the PCB. The device further includes a post extending from the frame. The device further includes a lever connected to the post. The lever includes a first end that aligns with a latch of the cable, with the cable connected to the connector, and with the frame fitted around the connector. The method further includes actuating the lever to cause the lever to depress the latch and release the cable from being retained by the connector. The method further includes removing the cable from the connector.

According to one aspect of the above embodiment, the method further includes slotting the cable through a gap in the frame of the cable release device, with the cable already connected to the connector. The method further includes fitting the frame of the cable release device around the connector on the PCB.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 2:
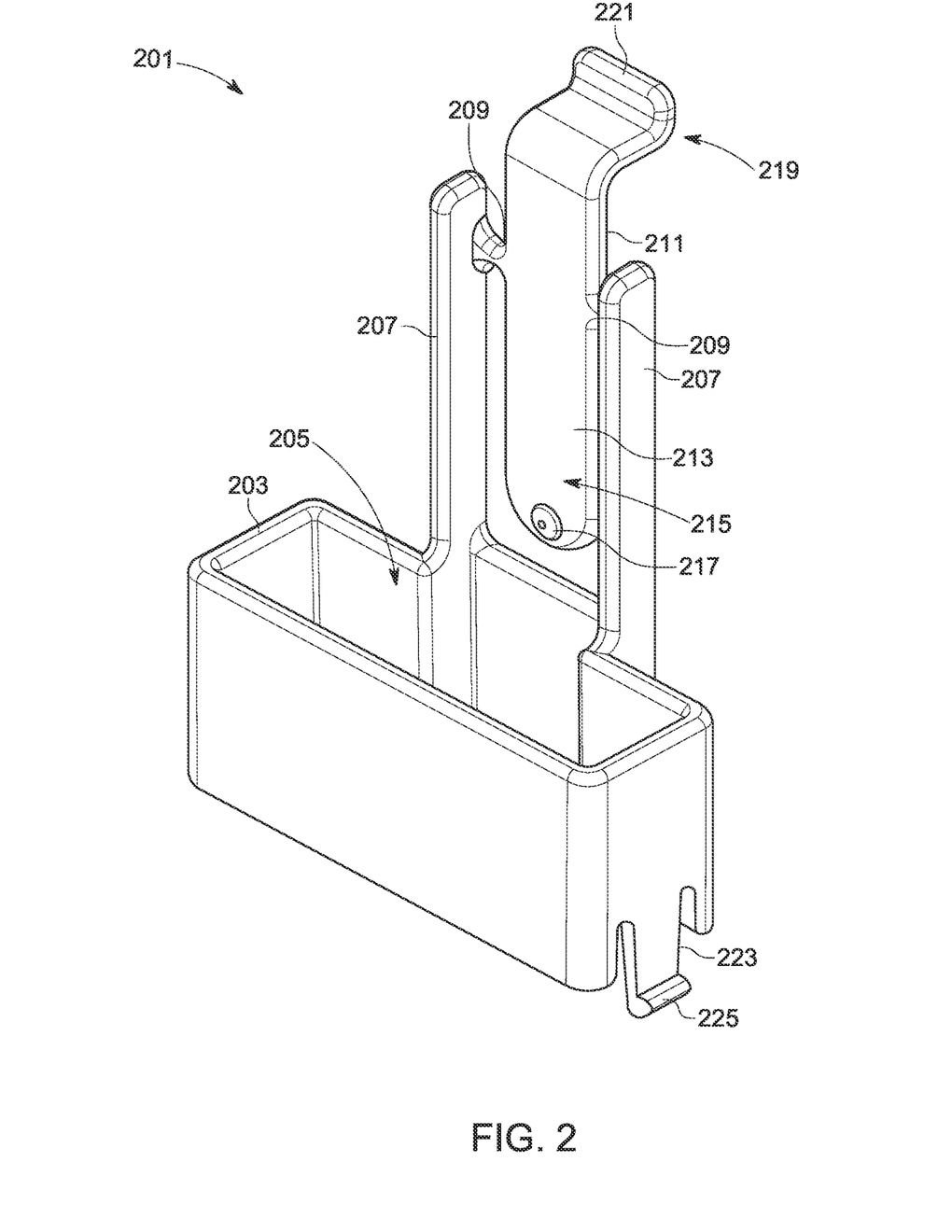
FIG. 2 shows a first perspective view of a cable release device, according to an aspect of the present disclosure.
Figure 3:
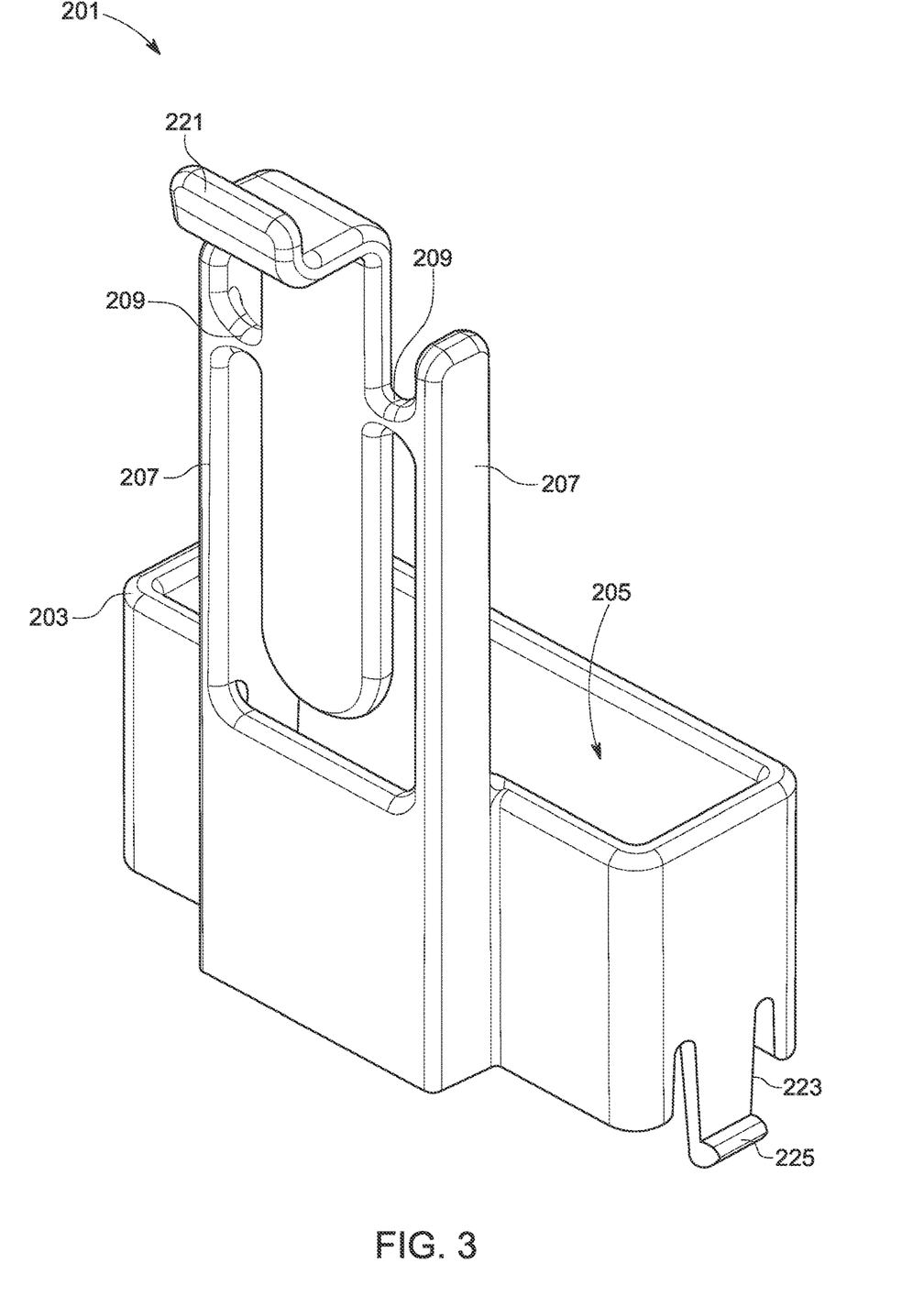
FIG. 3 shows a second perspective view, opposite of the first perspective view, of the cable release device in FIG. 2, according to an aspect of the present disclosure.

FIGS. 2 and 3 show first and second perspective views of a cable release device 201, according to an aspect of the present disclosure. In the orientation shown in FIGS. 2 and 3, the first and second perspective views can be considered front and rear perspective views, respectively. The device 201 includes a frame 203 defining an aperture 205. In one or more embodiments, the frame 203 is sized to fit around a connector on a printed circuit board (PCB) within a computer system—such as the connector 105 in FIG. 1—with the connector extending into the aperture 205. In one or more embodiments, the frame 203 can be 1 to 2 millimeters (mm) thick, such as 1.5 mm. This thickness allows the frame 203 to fit in tight spaces within a computer system.

In one or more embodiments, the perimeter of the frame 203 can correspond to a perimeter of the connector such that an outline of the frame 203 matches the outline of the connector. In one or more embodiments, the frame 203 can be sized to form an interference fit with the connector. In one or more alternative embodiments, the frame 203 can be sized to fit around more than one connector, such as two connectors, three connectors, etc.

The device 201 further includes two posts 207 that extend from the frame 203. In the orientation shown in FIGS. 2 and 3, the posts 207 extend up from the frame 203. Although the device 201 includes two posts 207, the device 201 can alternatively have one post 207 or more than two posts 207. For example, in one or more embodiments where the frame 203 is sized to fit around more than one connector, the device 201 can include a post 207, or a pair of posts 207, which each corresponds to another connector that the frame 203 can fit around.

The device 201 further includes a lever 211 connected to the posts 207 by junction points 209 that extend from the posts 207. Although one lever 211 is shown in FIG. 2, in one or more embodiments, the device 201 can include more than one lever 211. Each of the levers 211 can correspond with a different connector that fits within the aperture 205. Alternatively, a single lever 211 can actuate more than one latch (e.g., latch 109 of FIG. 1) when actuated.

When there is a pair of posts 207, the lever 211 can be between the pair of posts 207, as shown in FIGS. 2 and 3. Alternatively, the lever 211 can connect to a single post 207 by a single junction point 209. The junction point 209 also acts as a pivot point to allow the lever to release a cable, as further disclosed below.

The lever 211 includes a surface 213 that faces the aperture 205. The lever 211 further includes a first end 215 that aligns with a latch (e.g., latch 109 of FIG. 1) of a cable (e.g., cable 107 of FIG. 1) connected to a connector (e.g., connector 105 of FIG. 1) with the frame 203 fitted around the connector. This arrangement allows for the actuation of the lever 211 to depress the latch and release the cable from being retained by the connector, as further disclosed below. In one or more embodiments, the surface 213 at the first end 215 can include a touch point 217. The touch point 217 extends from the surface 213 of the lever 211 as a point of contact with the latch (e.g., latch 109 of FIG. 1) of the cable (e.g., cable 107 of FIG. 1).

The lever 211 further includes a second end 219, opposite from the first end 215. The second end 219 can include a curved portion 221. The curved portion 221 can provide more surface area for a user's finger (e.g., user's finger 111 in FIG. 1) to contact the lever 211 for actuating the lever 211, as disclosed below.

In one or more embodiments, the device 201 can further include a projection 223. The projection 223 extends from the frame 203 away from, or opposite, the posts 207. In the orientation shown in FIGS. 2 and 3, the projection 223 extends down from the frame 203. As disclosed further below, the projection 223 can cooperate with an aperture in a PCB to maintain the frame 203 fitted around a connector when actuating the lever 211. Further, in one or more embodiments, the projection 223 can include a hook 225. The hook 225 can fit within the aperture of the PCB to releasably fix the frame 203 to the PCB, as disclosed below.

Figure 4:
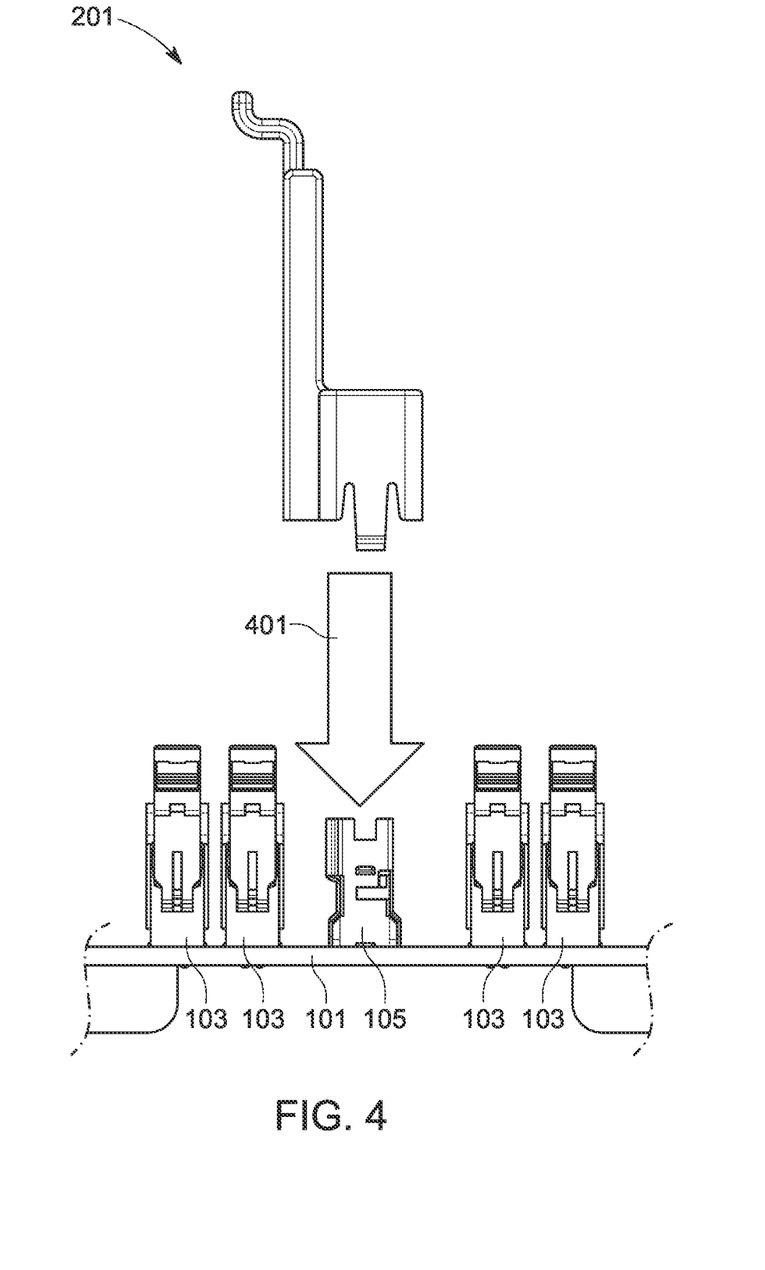
FIG. 4 shows a side view of a cable release device being lowered to fit around a connector of a PCB, according to an aspect of the present disclosure.

FIG. 4 shows a side view of the cable release device 201 of FIGS. 2 and 3 being lowered to fit around a connector 105 of a PCB 101, according to an aspect of the present disclosure. Specifically, the device 201 can be lowered in the direction of arrow 401 to fit around the connector 105.

Figure 5:
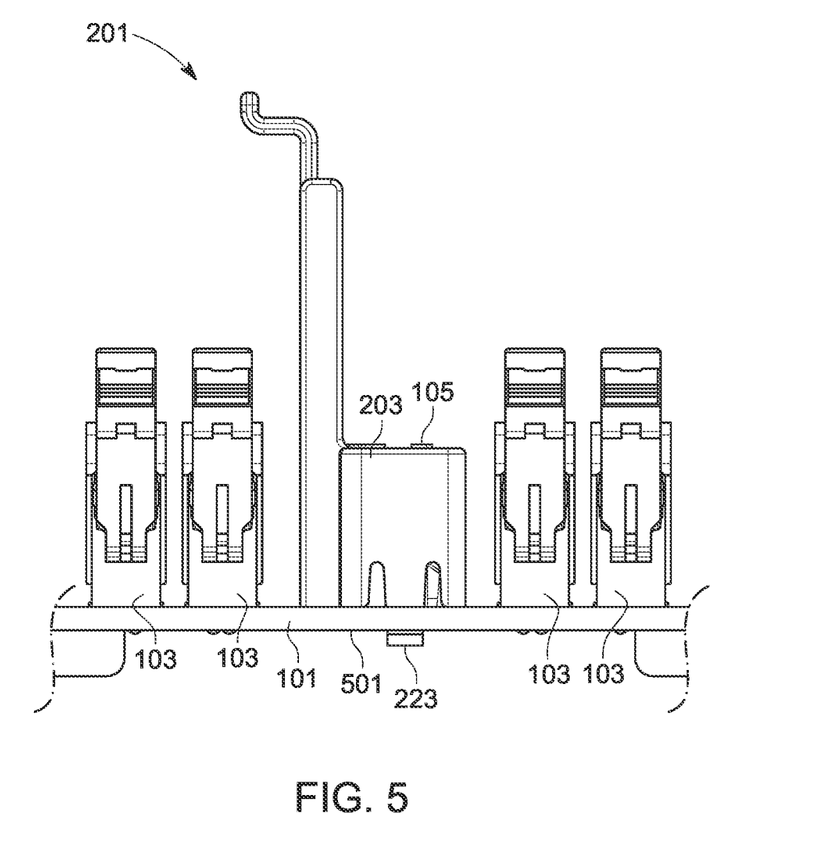
FIG. 5 shows a side view of a cable release device fitting around a connector of a PCB, according to an aspect of the present disclosure.

FIG. 5 shows a side view of the cable release device 201 connected to a PCB 101 and fitted around a connector 105 on the PCB 101, according to an aspect of the present disclosure. The projection 223 is shown extending through the PCB 101 so that it extends beyond a surface 501 of the PCB 101 opposite from the frame 203, as disclosed further below.

Figure 6:
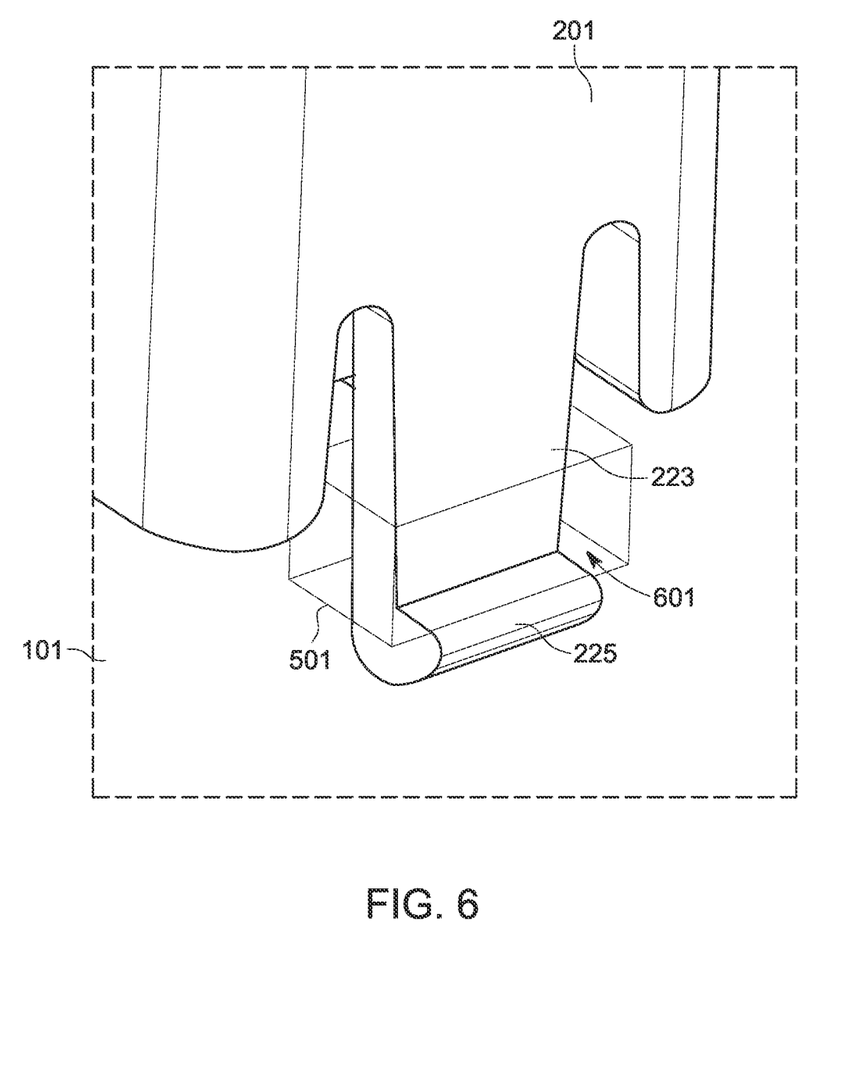
FIG. 6 shows a detailed perspective view of the cable release device connected to a PCB when fitted around a connector on the PCB, according to an aspect of the present disclosure.

FIG. 6 shows a detailed perspective view of the cable release device 201 connected to a PCB 101 when fitted around a connector 105 on the PCB 101, according to an aspect of the present disclosure. The PCB 101 includes an aperture 601 that extends through the PCB 101. The projection 223 includes the hook 225 that abuts the surface 501 of the PCB 101. The hook 225 assists in retaining the device 201 on the PCB 101 when a user actuates the lever 211.

Figure 7:
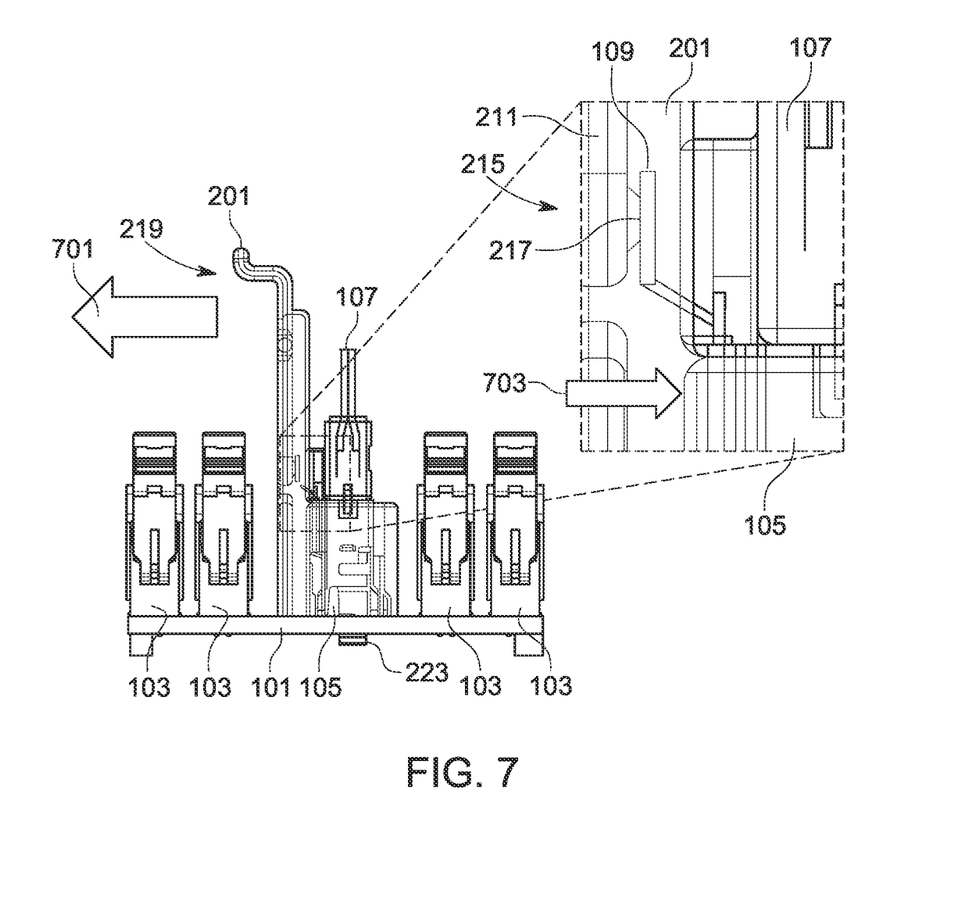
FIG. 7 shows a side view of a cable release device connected to a PCB and fitted around a connector of the PCB, according to an aspect of the present disclosure.

FIG. 7 shows a side view of the cable release device 201 fitting around a connector 105 of a PCB 101, according to an aspect of the present disclosure. Once the device 201 is fitted around the connector 105, a cable 107 can be connected to the connector 105.

With the cable 107 connected to the connector 105, the latch 109 of the cable 107 aligns with the first end 215 of the lever 211. As shown in the detailed portion of FIG. 7, when the lever 211 includes the touch point 217, the latch 109 of the cable 107 can align with the touch point 217 of the lever 211.

With the device 201 fitted around the connector 105, and the cable 107 connected to the connector 105, a user can release the cable 107 from being retained by the connector 105 by moving the second end 219 of the lever 211 in the direction of the arrow 701. Moving the second end 219 of the lever 211 in the direction of the arrow 701 causes the first end 215 (detailed portion) of the lever 211 to move in the opposite direction, as represented by the arrow 703 in the detailed portion. The first end 215 moving in the direction of the arrow 703 causes the first end to depress the latch 109, which releases the cable 107 from being retained by the connector 105. A user can then remove the cable 107.

Because the lever 211 extends up from the frame 203, a user can more easily move the second end 219 of the lever 211 in the direction of the arrow 701 than accessing the latch 109 directly with the user's finger. Thus, the device 201 allows for releasing cables, such as the cable 107, while maintaining the connector 105 close to adjacent slots 103. For example, the connector 105 and its adjacent slots 103 can be close enough so as to prevent access of a user's finger to the latch 109 while far enough apart to allow the device 201 to surround the connector 105. This opens up the possibility to have the connector 105 and the slots 103 closer together than conventionally possible without the device 201.

Figure 8:
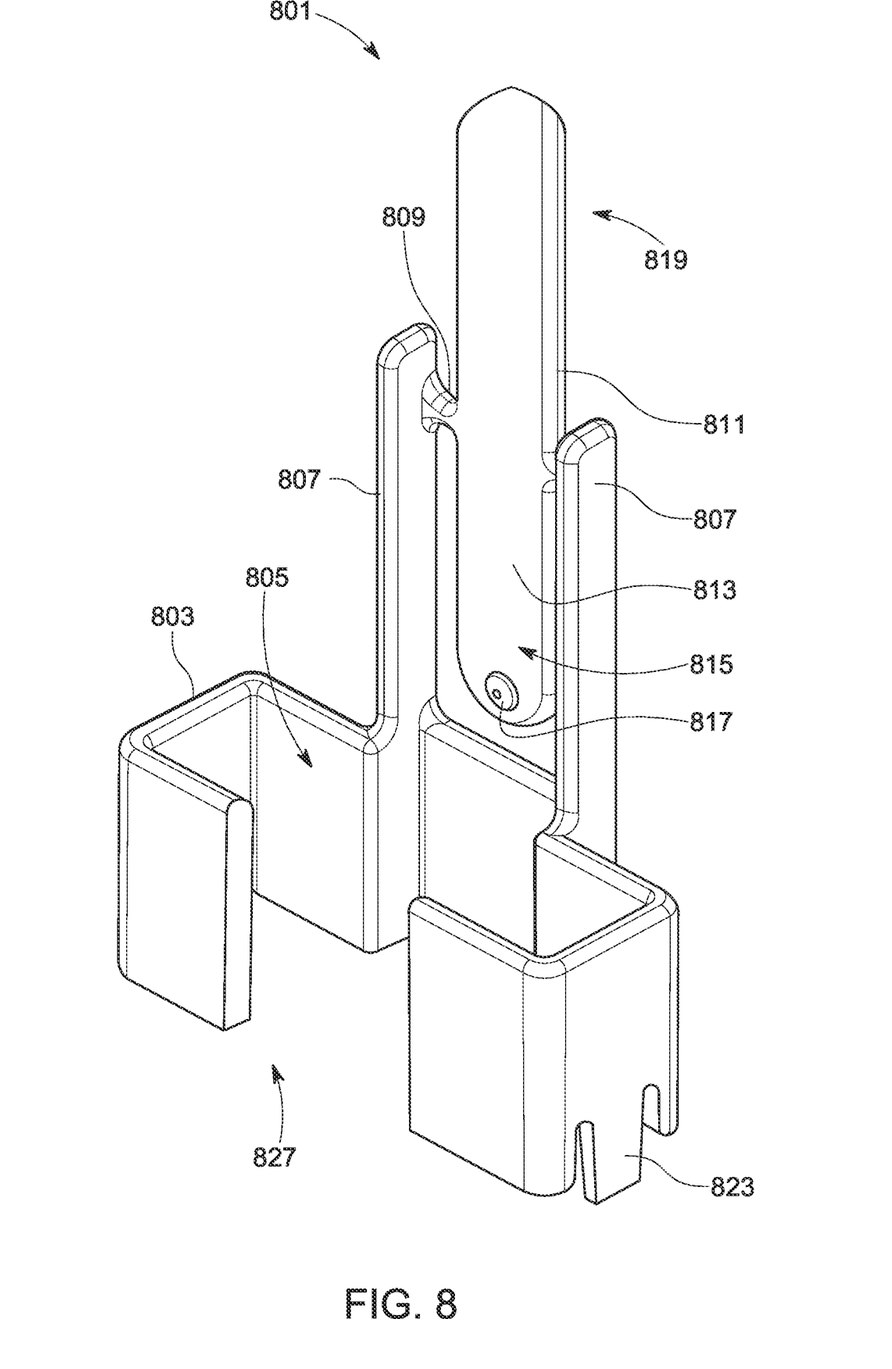
FIG. 8 shows a perspective view of a cable release device, according to another aspect of the present disclosure.

FIG. 8 shows a perspective view of a cable release device 801, according to another aspect of the present disclosure. Many of the aspects of the device 801 are similar to the device 201 disclosed above. For convenience, features of the device 801 labeled and described below with element numbers ending in the same ones and tens digits as the features of the device 201 disclosed above are identical, except as described below.

The frame 803 of the device 801 includes a gap 827. The gap 827 allows the frame 803 to be fitted around a connector (e.g., connector 105 of FIGS. 1, 4, 5, and 7) with the cable (e.g., cable 107 of FIGS. 1 and 7) already retained by the connector. Thus, one can still fit the device 801 around a connector, despite a cable already being connected to the connector, by simply slotting the cable through the gap 827 in the frame 803 prior to fitting the frame 803 around a connector.

Referring to the projection 823, and unlike the projection 223 of the device 201, the projection 823 does not include a hook. The projection 823 without a hook still assists with maintaining the device 801 in place when actuating the lever 811. However, a user can more easily remove the device 801 from being fitted around a connector once a cable has been removed from the connector by simply pulling up on the device 801. Thus, the combination of the projection 823 without the hook and the gap 827 in the frame 803 allows for a user to fit the device 801 around a connector, release a cable, and remove the device 801.

Referring to the second end 819 of the lever 811 of the device 801, the second end 819 can lack a curved portion (e.g., curved portion 221 of FIG. 2). Instead, the second end 819 can simply extend straight up from the frame 803. The length of the lever 811 can be longer than the length of the lever 211 (FIG. 2) to provide for easier access to the lever 811 despite not having a curved portion.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A device comprising:
   a frame defining an aperture, the frame being sized to fit around a connector on a printed circuit board (PCB), the PCB being within a computer system and the connector extending into the aperture;
   a post extending from the frame; and
   a lever connected to the post, the lever including a first end positioned such that the first end aligns with a latch of a cable when the cable is connected to the connector and when the frame is around the connector such that actuation of the lever causes the lever to depress the latch, the actuation causing the release of the cable from being retained by the connector.

2. The device of claim 1, wherein a perimeter of the frame corresponds to a perimeter of the connector.

3. The device of claim 1, further comprising:
   a projection extending from the frame, the projection cooperating with an aperture in the PCB to maintain the frame fitted around the connector as the lever is depressed.

4. The device of claim 3, wherein the projection includes a hook that releasably fixes the frame to the PCB.

5. The device of claim 1, wherein the post includes a pair of posts, and the lever is between the pair of posts.

6. The device of claim 1, wherein the lever is connected to the post at a junction point that allows the lever to rotate relative to the post.

7. The device of claim 1, wherein the lever includes a touch point that extends from the lever as a point of contact with the latch of the cable.

8. The device of claim 1, wherein a second end of the lever includes a curved section for providing more surface area for a user's finger to actuate the lever.

9. The device of claim 1, wherein the frame includes a gap that allows the frame to be fitted around the connector with the cable already retained by the connector.

10. A computer system comprising:
    a printed circuit board (PCB) with a connector for connecting a cable to the PCB; and
    a device for releasing the cable from being retained by the connector, the device including:
      a frame defining an aperture, the frame being sized to fit around the connector with the connector extending into the aperture and the device being coupled to the PCB;
      a post extending from the frame; and
      a lever connected to the post, the lever including a first end that aligns with a latch of the cable, with the cable connected to the connector, and with the frame fitted around the connector such that actuation of the lever causes the lever to depress the latch and release the cable from being retained by the connector.

11. The computer system of claim 10, wherein a perimeter of the frame corresponds to a perimeter of the connector.

12. The computer system of claim 10, wherein the PCB includes an aperture next to the connector, and the frame includes a projection that extends from the frame, the projection cooperating with the aperture to maintain the frame fitted around the connector as the lever is depressed.

13. The computer system of claim 12, wherein the projection comprises a hook that releasably fixes the device to the PCB.

14. The computer system of claim 10, wherein the post includes a pair of posts, and the lever is between the pair of posts.

15. The computer system of claim 10, wherein the lever is connected to the post at a junction point that allows the lever to rotate relative to the post.

16. The computer system of claim 10, wherein the lever includes a touch point that extends from the lever as a point of contact with the latch of the cable.

17. The computer system of claim 10, wherein a second end of the lever includes a curved section for providing more surface area for a user's finger to actuate the lever.

18. The computer system of claim 10, wherein the frame includes a gap that allows the frame to be fitted around the connector with the cable already retained by the connector.

19. A method comprising:
- providing a cable release device fitted around a connector of a printed circuit board (PCB), the connector being connected to a cable, the cable release device including:
  - a frame defining an aperture, the frame being sized to fit around the connector with the connector extending into the aperture and the cable release device being coupled to the PCB;
  - a post extending from the frame; and
  - a lever connected to the post, the lever including a first end that aligns with a latch of the cable, with the cable connected to the connector, and with the frame fitted around the connector;
- actuating the lever to cause the lever to depress the latch and release the cable from being retained by the connector; and
- removing the cable from the connector.

20. The method of claim 19, further comprising:
- slotting the cable through a gap in the frame of the cable release device, with the cable already connected to the connector; and
- fitting the frame of the cable release device around the connector on the PCB.

* * * * *